(12) United States Patent
Yip

(10) Patent No.: US 8,111,549 B2
(45) Date of Patent: Feb. 7, 2012

(54) DYNAMIC WORDLINE START VOLTAGE FOR NAND PROGRAMMING

(75) Inventor: Aaron Yip, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 12/460,073

(22) Filed: Jul. 13, 2009

(65) Prior Publication Data

US 2011/0007562 A1  Jan. 13, 2011

(51) Int. Cl.
*G11C 11/34* (2006.01)
(52) U.S. Cl. .......... 365/185.03; 365/185.18; 365/185.22
(58) Field of Classification Search .............. 365/185.03, 365/185.18, 185.22, 185.05, 63, 185.17, 365/185.25, 185.02
See application file for complete search history.

(56) References Cited

U.S. PATENT DOCUMENTS

| 6,969,868 | B2 | 11/2005 | Hannah et al. | |
|---|---|---|---|---|
| 7,170,771 | B2 | 1/2007 | Hannah et al. | |
| 7,459,321 | B2 | 12/2008 | Hannah et al. | |
| 2008/0266965 | A1* | 10/2008 | Takeuchi et al. | 365/185.17 |
| 2009/0296471 | A1* | 12/2009 | Goda et al. | 365/185.11 |

* cited by examiner

*Primary Examiner* — Dang Nguyen
(74) *Attorney, Agent, or Firm* — Blakely, Sokoloff, Taylor & Zafman LLP

(57) ABSTRACT

The present invention discloses a method of programming an MLC NAND flash memory device comprising: selecting a start value for a program voltage for a lower page; incrementing said program voltage to program said lower page; verifying a threshold voltage; determining said program voltage to achieve a desired value for said threshold voltage; applying an offset to said program voltage; and obtaining a start value for said program voltage for an upper page.

20 Claims, 3 Drawing Sheets

DYNAMIC WORDLINE START VOLTAGE FOR NAND PROGRAMMING

BACKGROUND OF THE INVENTION

1. Field of the Invention

The present invention relates to a field of semiconductor devices, and, more specifically, to programming NAND flash cells.

2. Discussion of Related Art

A flash device is a type of memory device in which cells may be erased and reprogrammed in blocks instead of one byte at a time. Each cell of the flash device uses one transistor to achieve high density, high reliability, and low power consumption.

The field effect transistor (FET) in the cell includes a floating gate between a P-substrate and a control gate. A word line is connected to the control gate of the transistor. A bit line is connected to the N+ source/drain diffusions straddling a channel below the floating gate in the P-substrate.

The floating gate can be programmed to hold a charge or erased to remove the charge. Both the program and the erase operations are accomplished through a Fowler-Nordheim tunneling mechanism.

The flash device using a single-level cell is in an erased ("1") state with a low threshold ("turn on") voltage when there is no excess of electrons in the insulating dielectric surrounding (below and above) the floating gate. The flash device using the single-level cell is in a programmed ("0") state when an excess number of electrons in the insulating dielectric increases the threshold voltage.

The most widespread flash memory array architectures include NOR and NAND. A NOR flash device is used for fast (direct random access) read, such as in code storage, for execute-in-place (XiP) functionality, such as in embedded applications, and for byte-write capabilities. A NAND flash device is used for fast write (program), fast erase, and fast (serial access) read operations in high-capacity file (disk) or large sequential-data storage applications, such as for consumer multimedia (audio or video) applications, as well as, PC data.

The NAND flash cell size ($4F^2$) is about half the size of the NOR flash cell size ($10F^2$) because NOR flash cells require a separate metal contact for each cell. The NOR flash cell also requires a larger transistor because it has to "pull down" an entire bit line with a larger amount of current.

The NAND flash device can perform 3 basic operations: read a page, program (write) a page (completely or partially), and erase a block. The block includes a fixed number of sequential pages.

It may be desirable to improve a programming speed of the NAND flash device using a multi-level cell. The present invention discloses a method to select a more efficient initial value for a start voltage for the gate when programming the MLC NAND flash device.

DETAILED DESCRIPTION OF THE PRESENT INVENTION

Figure 1:
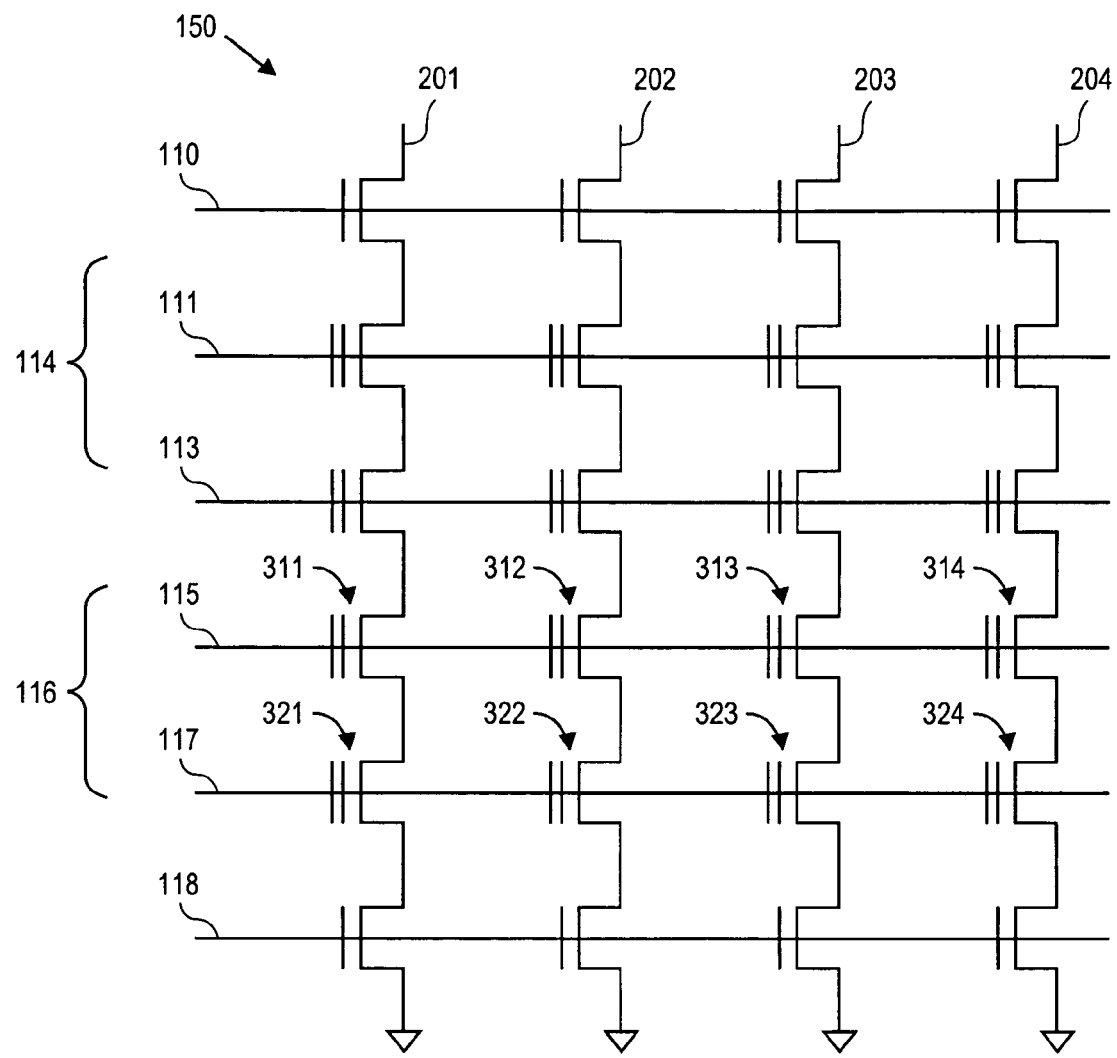
FIG. 1 shows word lines and bit lines in a NAND flash memory array according to an embodiment of the present invention.

In the following description, numerous details, examples, and embodiments are set forth to provide a thorough understanding of the present invention. However, it will become clear and apparent to one of ordinary skill in the art that the invention is not limited to the details, examples, and embodiments set forth and that the invention may be practiced without some of the particular details, examples, and embodiments that are described. In other instances, one of ordinary skill in the art will further realize that certain details, examples, and embodiments that may be well-known have not been specifically described so as to avoid obscuring the present invention.

An electronic system may include a microprocessor coupled to a memory device. The memory device may include a non-volatile memory device, such as a NAND flash device. The NAND flash device is called a single-level cell (SLC) if it stores one bit of data in a single memory cell. The SLC has 2 logical states that vary by a threshold voltage ($V_t$). The 2 corresponding data values include "1" and "0."

A block includes a fixed number of consecutive pages. Erasing a block in a SLC NAND flash device will set all bits in the block to "1" and all bytes to FFh. A block of 128 KB is the smallest size entity that can be erased in a NAND flash device.

Programming changes an erased bit from "1" to "0." The smallest entity that can be programmed is a byte. A byte has 8 bits while a word has 16 bits. Over-programming may occur when too many electrons are trapped in the insulating dielectric surrounding (below and above) the floating gate of the transistor. Over-programming is not a concern in the SLC NAND flash device.

A NAND flash device is called a multi-level cell (MLC) if it stores multi-bit of data in the single memory cell. For example, the MLC that stores 2 bits of data in a single memory cell will have 4 logical states that vary by the threshold voltage ($V_t$). The 4 corresponding data values include '11', '01', '00', and '10'.

The MLC NAND flash device may incrementally increase a program voltage to avoid over-programming. First, a word line is selected. Then, a program voltage generating circuit chooses a certain value for a start program voltage. A pulse at the start program voltage is initially applied to the selected word line. The word line is connected to a (control) gate of a transistor. For each subsequent pulse on the selected word line, the program voltage controller incrementally increases the program voltage to a higher value.

When the MLC NAND flash cells are being programmed, none of the cells should overshoot a target for the threshold voltage for each level. Consequently, the initial value for a gate voltage ($V_g$) is conservatively chosen in order to accommodate variability due to the fastest programming cell, programming speed-up due to repeated cycling, page-to-page variation, block-to-block variation, and so forth. The gate voltage is then progressively incremented for each succeeding program voltage pulse. The threshold voltage of the cell is verified in between consecutive program voltage pulses.

However, the first few program voltage pulses, especially at a beginning of life, are frequently ineffective for a majority of the pages.

As shown in an embodiment of the present invention in FIG. 1, a NAND memory array 150 includes word lines 111, 113, 115, 117 that intersect bit lines 201, 202, 203, 204. The word lines 111, 113, 115, 117 are arranged in rows while the bit lines 201, 202, 203, 204 are arranged in columns.

The word lines 111, 113, 115, 117 are connected to the control gates of the transistors. The bit lines are eventually connected to sense amplifiers that detect the state of each cell. The total number of word lines and the total number of bit lines depend on the density and layout of the NAND flash device.

The word lines 111, 113 constitute a block 114 that may be programmed together (completely or partially) or erased together. The word lines 115, 117 constitute another block 116 that may also be programmed together or erased together. Each block 114, 116 includes a fixed number, such as 16, 32, 64, or 128, of sequential pages. The block 114, 116 may be 8 KB or considerably larger.

The floating gate of each memory cell in the array is connected by rows to word select lines. However, each memory cell is not directly connected by its drain to a column bit line. Instead, the memory cells of the array are arranged together in strings of 8, 16, 32, 64, or more cells that determine a width in number of bits (I/O interface) of a bus. The memory cells 321, 311 in each string are connected together in series, source to drain, between a common source line and a column bit line. The source select gate (SGS) 118 includes a field effect transistor (FET). The drain select gate (SGD) 110 includes another field effect transistor (FET).

In some cases, dummy word lines, such as one next to the select gates at each end of the NAND string, may be included to improve reliability by minimizing the detrimental effects of Gate Induced Drain Leakage (GIDL).

The NAND memory array is accessed by a row decoder that activates a row of memory cells by selecting the word select line connected to their gates. A high bias voltage is applied to the select gate drain line. The word lines connected to the gates of the unselected memory cells of each group are driven, such as at $V_{pass}$, to operate the unselected memory cells of each group as pass transistors to pass current without being restricted by the data values that are stored. Current then flows from the source line to the column bit line through each series coupled group, only restricted by the selected memory cells of each group. This places the current encoded data values of the row of selected memory cells on the column bit lines.

During an operation to program memory cells 311, 313 in the odd or lower pages, the selected word line 115 that is connected to the memory cells 311, 313 is supplied with a series of program voltage pulses. Voltage pumps on the NAND flash die provide the high voltages required. The program voltages may start from about 15 volts (V) and increase incrementally to end at about 20 V.

A bit line 201 connected to the memory cell 311 is brought to a ground potential which can provide a gate-to-source potential of 20 V across the cell 311 that is to be programmed.

Unselected word lines 111, 113, 117, which have memory cells that are not being programmed, are biased at a pass voltage that is about 9-10 V.

Unselected memory cells 312, 314 on the selected word line 115 can also have the programming pulse applied. In order to prevent the unselected memory cells 312, 314 on the selected word line 115 from being programmed, their bit lines 202, 204 are biased to an inhibiting potential, such as a supply potential $V_{cc}$ that may be about 3-6 V.

Figure 2:
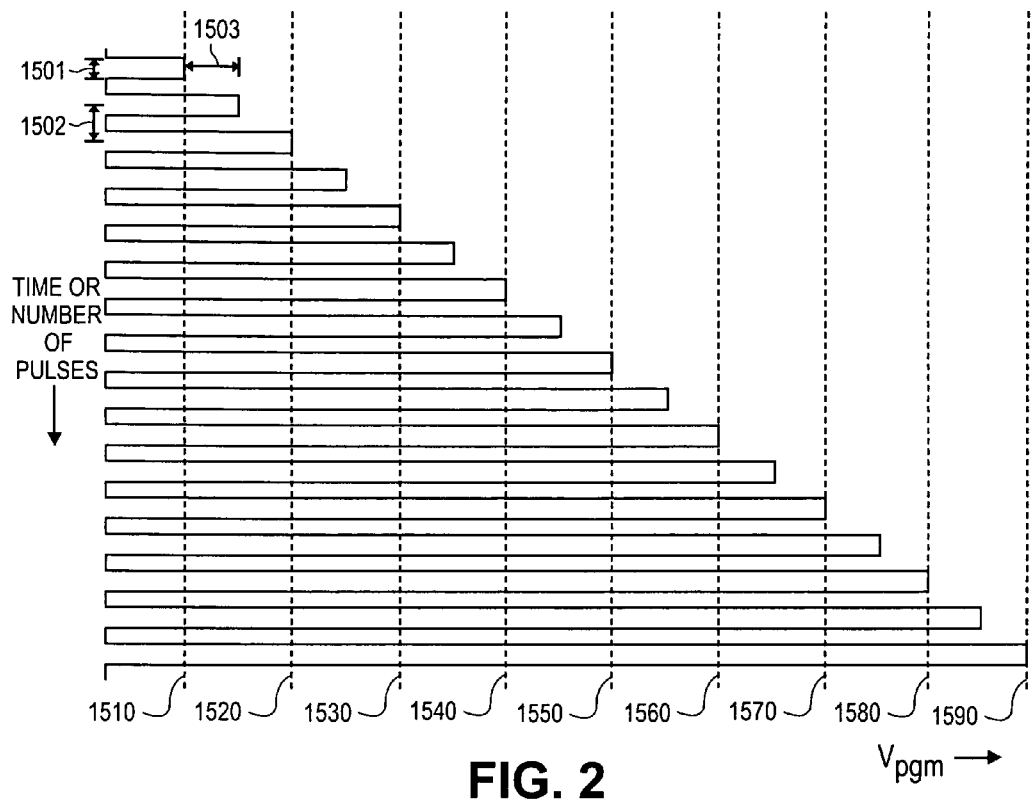
FIG. 2 shows a waveform diagram that includes incremental increases in program voltage ($V_{pgm}$) pulses according to an embodiment of the present invention.

As shown in an embodiment of the present invention in FIG. 2, a memory cell is incrementally programmed by applying a start program voltage ($V_{pgm}$) pulse 1510 to selected word lines in a memory block, followed by a series of program voltage pulses, until an end program voltage pulse achieves a target threshold voltage.

The start program voltage pulse may vary. In one case, the start program voltage pulse is 11-13 V. In another case, the start program voltage pulse is 13-15 V. In another case, the start program voltage pulse is 15-17 V. In another case, the start program voltage pulse is 17-19 V.

Each program voltage pulse has a pulse time duration 1501. In one case, the pulse time duration 1501 is constant (fixed). In another case, the pulse time duration 1501 may change.

Consecutive voltage program pulses are separated by a pulse time delta 1502. In one case, the time program delta is positive and constant (fixed). In a further case, the time program delta is variable (changing or fluctuating). In still a further case, the time program delta is positive and increasing monotonically. In yet a further case, the time program delta is negative and decreasing monotonically.

A total number of program voltage pulses may be applied. In one case, 3-8 program voltage pulses are applied. In another case, 9-19 program voltage pulses are applied. In still another case, 20-35 program voltage pulses are applied.

Each subsequent program voltage pulse includes a program voltage delta ($\Delta V_{pgm}$) 1503. The program voltage delta 1503 may be called a step-up voltage ($V_{step}$) if it is positive.

The program voltage delta 1503 is shown as constant (fixed) in FIG. 2. However, in other cases, the program voltage delta 1503 may be customized. In particular, more program voltage pulses (and longer programming time) may be required to shift threshold voltage due to an accumulation of charge on the floating gates of the memory cells as their threshold voltage is increased.

Furthermore, whenever appropriate, the customization of the program voltage delta 1503 may be implemented to help compensate for causes of variability. Some known and significant causes of variability include interference along the word lines, interference along the bit lines, and string resistance.

If desired, the customization of the program voltage delta 1503 may be based on experiment. Alternatively, the customization of the program voltage delta 1503 may be derived from simulation. If sufficient monitoring and control circuitry is available, the customization of the program voltage delta 1503 may be implemented in conjunction with a feedforward loop algorithm or a feedback loop algorithm.

In one case, the program voltage delta 1503 varies, such as with either a stepped or a continuous function, from a word line near a source side to a word line near a drain side.

In another case, the program voltage delta 1503 changes between the odd pages and the even pages of the memory block.

In one case, the program voltage delta 1503 is positive and constant (fixed), such as with a value of 0.1-0.3 V. In another case, the program voltage delta 1503 is positive and constant, such as with a value of 0.3-0.5 V. In still another case, the program voltage delta 1503 is positive and constant, such as with a value of 0.5-0.7 V. In yet another case, the program voltage delta 1503 is positive and constant, such as with a value of 0.7-0.9 V.

On the one hand, programming with a smaller program voltage delta 1503 results in a longer programming time (slower programming) than programming with a larger program voltage delta 1503. However, the smaller program voltage delta 1503 allows a program voltage distribution to be narrowed in the MLC NAND. In one case, the program voltage distribution may be tightened to an equivalent of twice of the program voltage delta that was being used.

On the other hand, increasing the magnitude of the program voltage delta 1503 will allow a shorter programming time (faster programming), but may risk an overshoot of the $V_t$ distribution (over-programming).

Furthermore, increasing the magnitude of the program voltage delta 1503 and/or increasing a total number of program voltage pulses will allow a larger shift in $V_t$ of the memory cell, but $V_{pass}$ and program disturb of adjacent cells will also become more likely to occur.

As dimensions in the NAND flash device are scaled down, parasitic capacitance coupling may occur between a selected word line and other adjacent word lines. The parasitic coupling may raise threshold voltage of a neighboring cell and make an unprogrammed cell appear to be programmed. A program disturb is one type of parasitic capacitance. The program disturb occurs when a programming operation for one page induces a change in bit value in an unrelated page.

In a further case, the program voltage delta 1503 is variable (changing or fluctuating). In still a further case, the voltage program delta 1503 is positive and increasing monotonically. In yet a further case, the voltage program delta 1503 is negative and decreasing monotonically.

In one case, a program verify pulse may be performed after each program voltage pulse to check the states of the MLC NAND memory cells. The program verify operation may include applying 1.0 V to a bit line associated with the memory cell, applying 0 V to a source line (SRC), and applying a read potential ($V_{read}$) to an unselected word line, the source select gate (SGS), and the drain select gate (SGD), and applying 1.0V to a selected word line, such as to a control gate of the memory cell. The voltage applied to the control gate, such as 1.0 V, corresponds with a lowermost $V_t$ level associated with a $V_t$ range. In one case, the read potential is 3.5 V.

Depending on the number of states available in the memory cell, a different number of program verify pulses may be performed between the program voltage pulses. In the case of a 4 logical states per memory cell, three program verify pulses may be performed between two sequential program voltage pulses.

Subsequently, the programming operation is terminated as soon as the program verify operation is passed. Then, the memory cell will have achieved a threshold voltage that is equal to or greater than the program verify level. The program verify level may be positioned to coincide with a lower end of the program voltage distribution corresponding to a certain program state in the memory cell.

During programming of the MLC NAND, the data or logical states of the multilevel memory cells are programmed in pages. An MLC NAND array that stores 2 bits of data in each memory cell will have 4 logical states per memory cell: one erase level and three program levels. The erase level corresponds to a negative $V_t$ while the three program levels correspond to three different values of a positive $V_t$.

In still another embodiment of the present invention, an MLC NAND array that stores 3 bits of data in each memory cell will have 9 logical states per memory cell: one erase level and neight program levels. The erase level corresponds to a negative $V_t$ while the program level corresponds to 8 different values of a positive $V_t$.

In yet another embodiment of the present invention, an MLC NAND array that stores 4 bits of data in each memory cell will have 16 logical states per memory cell: one erase level and 15 program levels. The erase level corresponds to a negative $V_t$ while the program level corresponds to 15 different values of a positive $V_t$.

Figure 3:
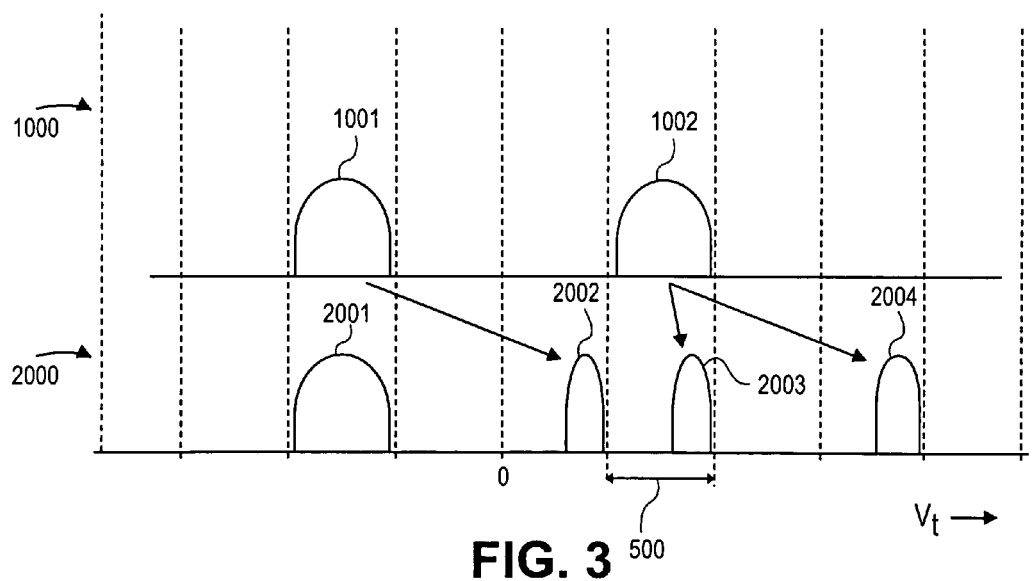
FIG. 3 shows programming of a first bit and of a second bit to target threshold voltages ($V_t$) according to an embodiment of the present invention.

The lower pages 1000 are typically programmed before the upper pages 2000 for the MLC NAND. FIG. 3 shows lower page data or logical states 1000, such as from an odd bit line, for a two-bit pattern. In general, the lower page programming for the MLC NAND is similar to programming for the SLC NAND.

In one case, an erased first bit will produce a "1" and result in a threshold voltage distribution 1001 as shown in FIG. 3 for a $V_{pgm}$ of 1530 as shown in FIG. 2.

In another case, programming the first bit to produce a "0" will result in a threshold voltage distribution 1002 as shown in FIG. 3 for a $V_{pgm}$ of 1560 as shown in FIG. 2.

The threshold voltage distribution 1002 as shown in FIG. 3 corresponds to an optimal lower page (odd bit line) voltage program $V_{pgm}$ of 1560 as shown in FIG. 2.

The optimal lower page (odd bit line) voltage program $V_{pgm}$ may be obtained by only programming and verifying the first bit or by determining an average after programming and verifying the first few bits.

The optimal lower page (odd bit line) voltage program $V_{pgm}$ may be recorded in the lower page itself or in another area in the memory that is distinct from the word line currently being programmed.

Since cycling is performed on a block basis, the optimal lower page (odd bit line) voltage program $V_{pgm}$ may be used to calibrate and determine an aggressive, yet safe, value for a start program voltage pulse for programming other lower pages of the same block.

Then an offset 500 is subtracted from the optimal lower page start voltage program 1560 to predict an optimal upper page (even bit line) start voltage program 1550. In one case, the offset may be based on a nominal difference in target threshold voltage between the lower page 1002 and the upper page 2002. If desired, an additional margin of error, such as to accommodate process variability, may be included by selecting a more conservative start voltage program, such as 1540.

FIG. 3 also shows upper page data or logical states 2000, such as from an even bit line. In one case, programming the second bit will produce a "11" which results in a threshold voltage distribution 2001 as shown in FIG. 3 for a $V_{pgm}$ of 1530 as shown in FIG. 2 for a "10" which results in a threshold voltage distribution 2004 as shown in FIG. 3 for a $V_{pgm}$ of 1580 as shown in FIG. 2.

In another case, programming the second bit will produce a "01" which results in a threshold voltage distribution 2002 as shown in FIG. 3 for a $V_{pgm}$ of 1530 as shown in FIG. 2 or a "00" which results in a threshold voltage distribution 2003 as shown in FIG. 3 for a $V_{pgm}$ of 1560 as shown in FIG. 2.

Both the threshold voltage distribution 1001 and the threshold voltage distribution 1002 as shown in FIG. 3 for the lower pages 1000 are very wide.

The threshold voltage distribution 2001 as shown in FIG. 3 for the upper pages 2000 is also very wide.

The threshold voltage distribution 2004 as shown in FIG. 3 for the upper pages 2000 is medium wide. Over-programming the threshold voltage distribution 2004 is not an issue since this is the highest logical state and thus a slightly higher $V_t$ will not encroach on a next higher logical state.

The threshold voltage distribution 2002 and the threshold voltage distribution 2003 as shown in FIG. 3 for the upper pages 2000 are very narrow.

As shown in FIG. 3, the threshold voltage distribution 2001 includes a MLC NAND memory cells that has a sub-zero, or negative, threshold voltage $V_t$.

The threshold voltage distribution 2001 as shown in FIG. 3 for $V_{pgm}$ of 1530 as shown in FIG. 2 represents a negative $V_t$ and a programmed state with data bits "11". The threshold voltage distribution 2002 as shown in FIG. 3 represents a positive $V_t$ and a programmed state with data bits "01". The threshold voltage distribution 2003 as shown in FIG. 3 represents a positive $V_t$ and a programmed state with data bits "00". The threshold voltage distribution 2004 as shown in FIG. 3 represents a positive $V_t$ and a programmed state with data bits "10".

Figure 4:
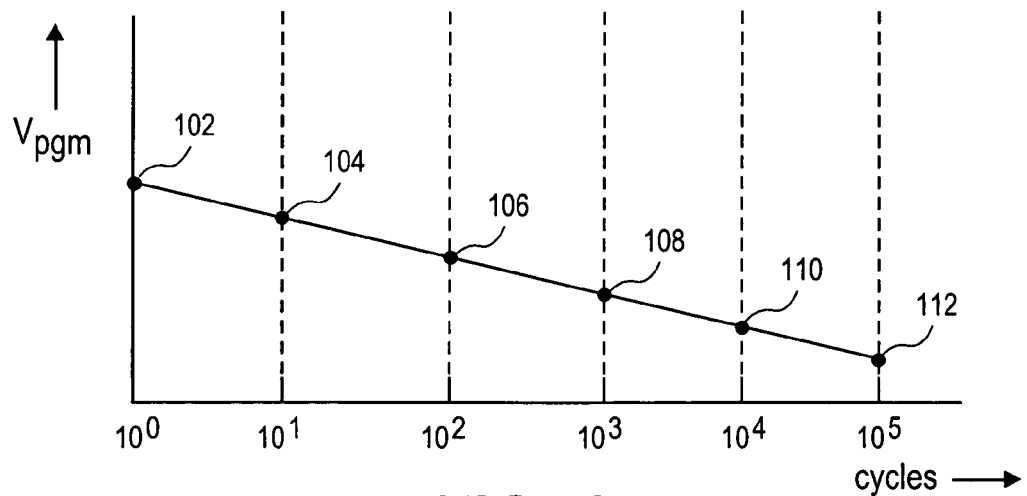
FIG. 4 shows exponential decrease in program voltage ($V_{pgm}$) after repeated cycles of program and erase according to an embodiment of the present invention.

As a total number of program and erase cycles increases, data retention may be degraded due to $V_t$ shifts. In particular, programming speed-up due to an increase in a total number of program and erase cycles may make the NAND flash device more susceptible to over-programming. As shown in an embodiment of the present invention in FIG. 4, the program voltage ($V_{pgm}$) 102, 104, 106, 108, 110, 112, etc. may decrease, such as exponentially, as a total number of program and erase cycles increases, such as from $10^0$ to $10^5$ cycles, etc.

In another case, programming slow-down may cause the program voltage ($V_{pgm}$) to increase (not shown), such as exponentially, as a total number of program and erase cycles increases, such as from $10^0$ to $10^5$ cycles, etc.

Figure 5:
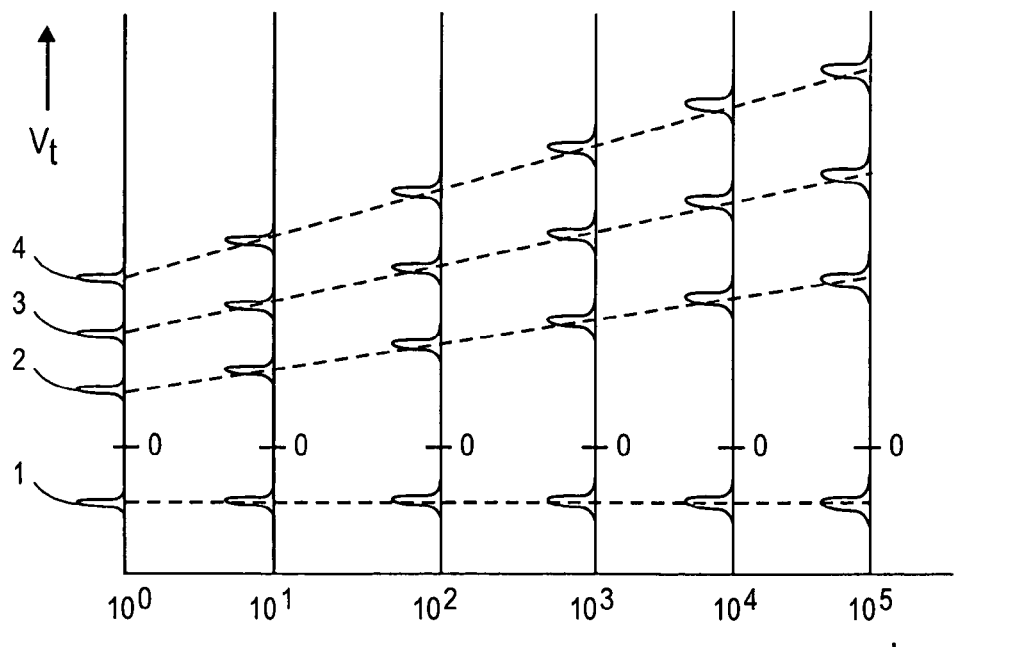
FIG. 5 shows programming speed-up of NAND flash memory cells as a result of cycling according to an embodiment of the present invention.

FIG. 5 shows a threshold voltage ($V_t$) distribution 1, 2, 3, 4 of a group of MLC NAND flash memory cells. The separation between adjacent threshold voltage distributions 1, 2, 3, 4 becomes larger as the total number of program and erase cycles increases. The width of each threshold voltage distribution may also become larger as the number of program and erase cycles increases.

In another case, the separation between adjacent threshold voltage distributions becomes smaller (not shown) as the total number of program and erase cycles increases. The width of each threshold voltage distribution may also become larger as the number of program and erase cycles increases.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

I claim:

1. A method of programming an MLC NAND flash memory device comprising:
   selecting a start value for a program voltage for a lower page;
   incrementing said program voltage to program said lower page, wherein an incremental change amount for the program voltage varies between an odd page and an even page;
   verifying a threshold voltage;
   determining said program voltage to achieve a desired value for said threshold voltage;
   applying an offset to said program voltage; and
   obtaining a start value for said program voltage for an upper page.

2. The method of claim 1 wherein programming said lower page of said MLC NAND is similar to programming an SLC NAND flash memory device.

3. The method of claim 1 wherein said lower page comprises one erased state and one programmed state.

4. The method of claim 1 wherein said lower page comprises a state of "1" for said erased state.

5. The method of claim 1 wherein said lower page comprises a state of "0" for said programmed state.

6. The method of claim 1 wherein said upper page comprises one erased state and three programmed states.

7. The method of claim 1 wherein said upper page comprises a state of "11" for said erased state.

8. The method of claim 1 wherein said upper page comprises three programmed states of "01", "00", and "10".

9. An MLC NAND flash memory device comprising:
   incrementing a first program voltage to program said lower page, wherein an incremental change amount for the program voltage varies between an odd page and an even page;
   a first program voltage to achieve a desired threshold voltage for a lower page; and
   a second program voltage to achieve a desired threshold voltage for an upper page wherein an offset separates said first program voltage from said second program voltage.

10. The MLC NAND flash memory device of claim 9 wherein said lower page corresponds to a first bit.

11. The MLC NAND flash memory device of claim 9 wherein said upper page corresponds to a second bit.

12. The MLC NAND flash memory device of claim 9 wherein said lower page comprises a state of "1" for an erased state.

13. The MLC NAND flash memory device of claim 9 wherein said lower page comprises a state of "0" for a programmed state.

14. The MLC NAND flash memory device of claim 9 wherein said upper page comprises a state of "11" for an erased state.

15. The MLC NAND flash memory device of claim 9 wherein said upper page comprises three programmed states of "01", "00", and "10".

16. A method of reducing programming time for an MLC NAND flash memory device comprising:
   incrementing said program voltage to program said lower page, wherein an incremental change amount for the program voltage varies between an odd page and an even page;
   determining a first program voltage to achieve a desired threshold voltage for a lower page;
   applying an offset to said program voltage; and
   obtaining a second program voltage to achieve a desired threshold voltage for an upper page.

17. The method of claim 16 wherein said lower page comprises a state of "1" for an erased state.

18. The method of claim 16 wherein said lower page comprises a state of "0" for a programmed state.

19. The method of claim 16 wherein said upper page comprises a state of "11" for an erased state.

20. The method of claim 16 wherein said upper page comprises three programmed states of "01", "00", and "10".

* * * * *